United States Patent
Hemley et al.

(10) Patent No.: US 7,594,968 B2
(45) Date of Patent: *Sep. 29, 2009

(54) ULTRATOUGH CVD SINGLE CRYSTAL DIAMOND AND THREE DIMENSIONAL GROWTH THEREOF

(75) Inventors: Russell J. Hemley, Washington, DC (US); Ho-kwang Mao, Washington, DC (US); Chih-shiue Yan, Washington, DC (US)

(73) Assignee: Carnegie Institution of Washington, Washington, DC (US)

( * ) Notice: Subject to any disclaimer, the term of this patent is extended or adjusted under 35 U.S.C. 154(b) by 336 days.

This patent is subject to a terminal disclaimer.

(21) Appl. No.: 11/222,224

(22) Filed: Sep. 9, 2005

(65) Prior Publication Data

US 2006/0065187 A1 Mar. 30, 2006

Related U.S. Application Data

(60) Provisional application No. 60/608,516, filed on Sep. 10, 2004.

(51) Int. Cl.
*C30B 29/04* (2006.01)

(52) U.S. Cl. .................. 117/109; 117/106; 117/929; 423/446

(58) Field of Classification Search ........... 117/4, 117/5, 105, 109, 929; 423/446
See application file for complete search history.

(56) References Cited

U.S. PATENT DOCUMENTS

| | | | | |
|---|---|---|---|---|
| 4,985,226 A | 1/1991 | Satoh et al. | ........... | 423/446 |
| 5,099,788 A | 3/1992 | Ito et al. | ........... | 118/666 |
| 5,209,182 A | 5/1993 | Ohta et al. | ........... | 118/666 |
| 5,562,769 A | 10/1996 | Dreifus et al. | ........... | 117/86 |
| 5,704,976 A | 1/1998 | Snail | ........... | 117/98 |
| 5,743,957 A | 4/1998 | Kobashi | ........... | 117/929 |
| 5,792,256 A | 8/1998 | Kucherov et al. | ........... | 117/89 |
| 5,955,155 A | 9/1999 | Yamamoto et al. | | |
| 5,980,982 A | 11/1999 | Degawa et al. | | |
| 6,129,900 A * | 10/2000 | Satoh et al. | ........... | 423/446 |
| 6,582,513 B1 | 6/2003 | Linares et al. | ........... | 117/93 |
| 6,913,424 B2 * | 7/2005 | Yoshihiro et al. | ........... | 407/42 |
| 2003/0230232 A1 | 12/2003 | Frushour et al. | ........... | 117/68 |
| 2006/0185583 A1 * | 8/2006 | Hemley et al. | ........... | 117/104 |
| 2007/0077192 A1 * | 4/2007 | Hemley et al. | ........... | 423/446 |

(Continued)

FOREIGN PATENT DOCUMENTS

WO    WO 01/31082 A1    5/2001

(Continued)

OTHER PUBLICATIONS

B.V. Spitsyn et al., "Vapor Growth of Diamond on Diamond and Other Surfaces", Journal of Crystal Growth 52 (1981) pp. 219-226.

(Continued)

*Primary Examiner*—Robert M Kunemund
(74) *Attorney, Agent, or Firm*—Morgan Lewis & Bockius LLP (57) ABSTRACT

The invention relates to a single-crystal diamond grown by microwave plasma chemical vapor deposition that has a toughness of at least about 30 MPa m$^{1/2}$. The invention also relates to a method of producing a single-crystal diamond with a toughness of at least about 30 MPa m$^{1/2}$. The invention further relates to a process for producing a single crystal CVD diamond in three dimensions on a single crystal diamond substrate.

12 Claims, 4 Drawing Sheets

Temperature effect

FOREIGN PATENT DOCUMENTS

WO        WO 01/96633 A1     12/2001

OTHER PUBLICATIONS

Mutsukazu Kamo et al., "Diamond Synthesis From Gas Phase in Microwave Plasma", Journal of Crystal Growth 62 (1983) pp. 642-644.

Jean-Pierre Vitton et al., "High Quality Homoepitaxial Growth of Diamond Films", Diamond and Related Materials, 2 (1993) pp. 713-717.

G.Z. Cao et al., "Growth of {100} Textured Diamond Films by the Addition of Nitrogen" Journal of Applied Physics, vol. 79, No. 3, Feb. 1, 1996, pp. 1357-1364.

S. Jin et al., "Effect of Nitrogen on the Growth of Diamond Films", Applied Physics Letters, vol. 65, No. 4, Jul. 25, 1994, pp. 403-405.

W. Müller-Sebert et al., "Nitrogen Induced Increase of Growth Rate in Chemical Vapor Deposition of Diamond" Applied Physics Letters. vol. 68, No. 1, Jan. 1, 1996, pp. 759-760.

A. Afzal et al., "HFCVD Diamond Grown With Added Nitrogen: Film Characterization and Gas-Phase Composition Studies", Diamond and Related Materials 7 (1998) pp. 1033-1038.

Dr. R.S. Sussmann, A New Diamond Material for Optics & Electronics, IDR 2/93 New Products. pp. 63-72.

X. Jiang et al., "The Coalescence of [001] Diamond Grains Heteroepitaxially Grown on (001) Silicon" Applied Physics Letters, vol. 69, No. 24, Dec. 9, 1996, pp. 3902-3904.

M. Schreck et al., "Diamond Nucleation on Iridium Buffer Layers and Subsequent Textured Growth: A Route for the Realization of Single-Crystal Diamond Films" Applied Physics Letters, vol. 78, No. 2, Jan. 8, 2001, pp. 192-194.

Ji-an Xu et al., Moissanite: A Window for High-Pressure Experiments, Science vol. 290, Oct. 27, 2000, pp. 783-785.

Chih-Shiue Yan et al., "Multiple Twinning and Nitrogen Defect Center in Chemical Vapor Deposited Homoepitaxial Diamond" Diamond and Related Materials 8 (1999), pp. 2022-2031.

M.A. Tamor et al., "On the role of penetration twins in the morphological development of vapor-grown diamond films", Journal of Materials Research, vol. 9, No. 7, Jul. 1994, pp. 1839-1848.

R.E. Stallcup II et al., "Scanning Tunneling Microscopy Studies of Temperature-Dependent Etching of Diamond (100) by Atomic Hydrogen", Physical Review Letters, vol. 86, No. 15, Apr. 9, 2001, pp. 3368-3371.

Yogesh K. Vohra et al., "Resonance Raman and photoluminescence investigations of micro-twins in homoepitaxially grown chemical vapor deposited diamond", Applied Physics Letters, vol. 71, No. 3, Jul. 21, 1997, pp. 321-323.

J. te Nijenhuis et al., "Red luminescence is phosphorous-doped chemically vapor deposited diamond", Journal of Applied Physics, vol. 82 (1), Jul. 1, 1997, pp. 419-422.

Mikka Nishitani-Gamo et al., "Confocal Raman spectroscopic observation of hexagonal diamond formation from dissolved carbon in nickel under chemical vapor conditions" Applied Physics Letters, vol. 73, No. 6, Aug. 10, 1998, pp. 765-767.

C.F.O Graeff et al. "Optical excitation of paramagnetic nitrogen in chemical vapor deposited diamond", Applied Physics Letters, vol. 69, No. 21, Nov. 18, 1996, pp. 3215-3217.

A.T. Collins, "Vacancy enhanced aggregation of nitrogen in diamond", J. Phys. C: Solid St. Phys., 13 (1980), pp. 2641-2650.

Alan T. Collins et al., "Color changes produced in natural brown diamonds by high-pressure, high-temperature treatment", Diamond and Related Materials 9 (2000), pp. 113-122.

Isao Sakaguchi et al., "Suppression of surface cracks on (111) homoepitaxial diamond through impurity limitation by oxygen addition", Applied Physics Letters, vol. 73, No. 18, Nov. 2, 1998, pp. 2675-2677.

Y. Liou et al. "The effect of oxygen in diamond deposition by microwave plasma enhanced chemical vapor deposition", Journal of Materials Research, vol. 5, No. 11, Nov. 1990, pp. 2305-2312.

C. Wild et al., "Oriented CVD diamond films: twin formation, structure and morphology", Diamond and Related Materials, 3 (1994) pp. 373-381.

Chih-Shiue Yan et al., "Very high growth rate chemical vapor deposition of single-crystal diamond", vol. 99 (Oct. 1, 2002) pp. 12523-12525.

Diamond 2003—Oral Programme, 14 European Conference on Diamond, Diamond-like Materials, Carbon Nanotubes, Nitrides and Silicon Carbide.

Jan Isberg et al., "High Carrier Mobility in Single-Crystal Plasma-Deposited Diamond" Science, vol. 297, Issue 5587, 1670-1672, Sep. 6, 2002 [DOI: 10.1126/science.1074374].

Takahiro Imai et al., Synthesis of Large Free-Standing Diamond Single Crystals By Homoepitaxial Growth.

Patrick Doering et al., Large Area Single Crystal CVD Diamond: Properties and Applications.

Tetsuo Irifune et al., "Materials: Ultrahard Polycrystalline Diamond From Graphite", Nature 421, 599-600 (Feb. 6, 2003); doi:10.1038/421599b.

Wuyi Wang, Featured Lab Note: Another Commercial U.S. Facility Offers HPHT Annealing, Summer 2002, Gems & Gemology, vol. 38, Issue 2, Jul. 29, 2004.

M. D. Drory et al. "Fracture of Synthetic Diamond", Department of Materials Science and Engineering, (Received Mar. 10, 1995; accepted for publication May 11, 1995).

J.E. Shigley, et al., "Gemological Identification of HPHT-Annealed Diamonds", Seventh Annual V.M. Goldschmidt Conference (2001).

\* cited by examiner

Figure 1. Temperature effect

Figure 2. Indented patterns

Figure 3. Photoluminence

Figure 4. FTIR of CVD and aCVD

ULTRATOUGH CVD SINGLE CRYSTAL DIAMOND AND THREE DIMENSIONAL GROWTH THEREOF

The present invention claims the benefit of Provisional Application No. 60/608,516 filed on Sep. 10, 2004, which is hereby incorporated by reference in its entirety.

STATEMENT OF GOVERNMENT INTEREST

This invention was made with U.S. government support under grant number EAR-0135626 from the National Science Foundation and instrument number DE-FC03-03NA00144 from the U.S. Department of Energy. The U.S. government has certain rights in the invention.

BACKGROUND OF THE INVENTION

1. Field of the Invention

The present invention relates to an annealed single-crystal CVD diamond having an extremely high toughness. The invention also relates to a process for producing a single-crystal CVD diamond in three dimensions on a single crystal diamond substrate using Microwave Plasma Chemical Vapor Deposition (MPCVD) within a deposition chamber.

2. Description of Related Art

Large-scale production of synthetic diamond has long been an objective of both research and industry. Diamond, in addition to its gem properties, is the hardest known material, has the highest known thermal conductivity, and is transparent to a wide variety of electromagnetic radiation. Monocrystalline diamond in particular possess a wide range of important properties, including a low coefficient of thermal expansion, the highest known thermal conductivity, chemical inertness, wear resistance, low friction, and optical transparency from the ultra-violet (UV) to the far infrared (IR). Therefore, it is valuable because of its wide range of applications in a number of industries and research applications, in addition to its value as a gemstone.

For at least the last twenty years, a process of producing small quantities of diamond by chemical vapor deposition (CVD) has been available. As reported by B. V. Spitsyn et al. in "Vapor Growth of Diamond on Diamond and Other Surfaces," Journal of Crystal Growth, vol. 52, pp. 219-226, the process involves CVD of diamond on a substrate by using a combination of methane, or another simple hydrocarbon gas, and hydrogen gas at reduced pressures and temperatures of 800-1200° C. The inclusion of hydrogen gas prevents the formation of graphite as the diamond nucleates and grows. Growth rates of up to 1 µm/hour have been reported with this technique.

Subsequent work, for example, that of Kamo et al. as reported in "Diamond Synthesis from Gas Phase in Microwave Plasma," Journal of Crystal Growth, vol. 62, pp. 642-644, demonstrated the use of Microwave Plasma Chemical Vapor Deposition (MPCVD) to produce diamond at pressures of 1-8 kPa at temperatures of 800-1000° C. with microwave power of 300-700 W at a frequency of 2.45 GHz. A concentration of 1-3% methane gas was used in the process of Kamo et al. Maximum growth rates of 3 µm/hour have been reported using this MPCVD process. In the above-described processes, and in a number of other reported processes, the growth rates are limited to only a few micrometers per hour.

Methods of improving the growth rates of single-crystal chemical vapor deposition (SC-CVD) diamonds have recently been reported, and these methods have opened new opportunities for the application of diamond for gems, optics, and electronics.

U.S. Pat. No. 6,858,078 to Hemley et al. is directed to an apparatus and method for diamond production. The disclosed apparatus and method can lead to the production of diamonds that are light brown to colorless.

U.S. patent application Ser. No. 10/889,171 is directed to annealing single-crystal chemical vapor deposition diamonds. Important inventive features include raising the CVD diamond to a set temperature of at least 1500° C. and a pressure of at least 4.0 GPa outside of the diamond stable phase.

U.S. patent application Ser. No. 10/889,170 is directed to diamonds with improved hardness. The application discloses a single-crystal diamond with a hardness greater than 120 GPa.

U.S. patent application Ser. No. 10/889,169 is directed to diamonds with improved toughness. The application discloses a single-crystal diamond with a fracture toughness of 11-20 $MPam^{1/2}$ and a hardness of 50-90 GPa.

The aforementioned disclosures do not disclose single-crystal diamonds having a toughness over 20 $MPam^{1/2}$. Nor do they disclose methods to produce single-crystal diamond with growth in three dimensions on a single crystal diamond substrate.

SUMMARY OF THE INVENTION

Accordingly, the present invention is directed to a single-crystal diamond and a method of producing such a diamond that substantially obviates one or more of the problems due to limitations and disadvantages of the related art.

An object of the present invention relates to an ultratough diamond and a method of producing such a diamond in a microwave plasma chemical vapor deposition system. Another object of the present invention relates to a method to produce single-crystal diamond with growth in three dimensions on a single crystal diamond substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an embodiment of the invention comprises a single-crystal diamond grown by microwave plasma chemical vapor deposition that has a toughness of at least about 30 $MPa\,m^{1/2}$.

Another embodiment of the invention relates to a method for growing an ultratough, single-crystal diamond comprising:

i) placing a seed diamond in a heat sink holder made of a material that has a high melting point and high thermal conductivity to minimize temperature gradients across the growth surface of the diamond;

ii) controlling the temperature of a growth surface of the diamond such that the temperature of the growing diamond crystals is in the range of about 1050-1200° C.; and iii) growing single-crystal diamond by microwave plasma chemical vapor deposition on the growth surface of a diamond in a deposition chamber, wherein the atmosphere comprises a nitrogen to methane ratio of about 4% $N_2/CH_4$, iv) annealing the single-crystal diamond such that the annealed single-crystal diamond has a toughness of at least about 30 MPa $m^{1/2}$.

Another embodiment of the invention relates to a process for producing a single crystal CVD diamond in three dimensions on a single crystal diamond substrate, comprising:

i) growing single crystal diamond in a first <100> face of the single crystal diamond substrate;

ii) repositioning the single crystal diamond substrate with the grown single crystal diamond thereon; and iii) growing single crystal diamond in a second <100> face of the single crystal diamond substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, the results of which are illustrated in the accompanying drawings.

The microwave plasma CVD-grown single-crystal diamond referred to in this application were grown with the apparatus described in U.S. patent application Ser. No. 10/288,499, filed on Nov. 6, 2002, now U.S. Pat. No. 6,858,078, entitled "Apparatus and Method for Diamond Production," which is hereby incorporated by reference.

One embodiment of the invention includes a single-crystal diamond grown by microwave plasma chemical vapor deposition that has a toughness of at least about 30 MPa $m^{1/2}$. In another embodiment, the toughness of the single-crystal diamond is at least about 35 MPa $m^{1/2}$. In another embodiment, the toughness of the single-crystal diamond is at least about 40 MPa $m^{1/2}$.

The diamonds in these embodiments of the invention were subjected to annealing, for example, at temperatures of about 2000° C. to about 2700° C. for about 10 minutes using a belt-type apparatus. This caused a dramatic increase in the hardness of the diamonds. In another embodiment, the hardness is from about 100 to about 160 GPa.

The hardness in the aforementioned embodiments of the invention is determined by the equation of $H_v=1.854\times P/D^2$ in which P is the maximum load used on the indenter to form an indentation into the single crystal diamond and D is the length of the longest crack formed by the indenter in the single crystal diamond and h is the depth of the indentation into the single crystal diamond.

The toughness, or fracture toughness, $K_c$ of the single crystal diamond in the aforementioned embodiments is determined by the equation of $$K_c=(0.016\pm0.004)(E/H_v)^{1/2}(P/C^{3/2}),$$

in which E is the Young's modulus of diamond, d is the average length of the indentation cavity in the single crystal diamond, and c is the average length of the radial cracks in the single crystal diamond.

Another embodiment includes a method for growing an ultratough, single-crystal diamond comprising:

i) placing a seed diamond in a heat sink holder made of a material that has a high melting point and high thermal conductivity to minimize temperature gradients across the growth surface of the diamond;

ii) controlling the temperature of a growth surface of the diamond such that the temperature of the growing diamond crystals is in the range of about 1050-1200° C.; and iii) growing single-crystal diamond by microwave plasma chemical vapor deposition on the growth surface of a diamond in a deposition chamber, wherein the atmosphere comprises a nitrogen to methane ratio of about 4% $N_2/CH_4$, iv) annealing the single-crystal diamond such that the annealed single-crystal diamond has a toughness of at least about 30 MPa $m^{1/2}$.

In another embodiment, the aforementioned method further comprises annealing the single-crystal diamond at pressures in excess of about 5 to about 7 GPa and temperatures of from about 2000° C. to about 2700° C. such that the hardness is from about 100 to about 160 GPa. In yet another embodiment, the single crystal diamond prior to annealing is substantially colorless.

Another embodiment of the invention includes a process for producing a single crystal CVD diamond in three dimensions on a single crystal diamond substrate, comprising:

i) growing single crystal diamond in a first <100> face of the single crystal diamond substrate;

ii) repositioning the single crystal diamond substrate with the grown single crystal diamond thereon; and iii) growing single crystal diamond in a second <100> face of the single crystal diamond substrate. In another embodiment for producing single crystal CVD diamond in three dimensions, the deposition temperature is from about 1150° C. to about 1250° C. In another embodiment, the three dimensional diamond produced is larger than about one cubic inch.

Microwave plasma chemical vapor deposition (MPCVD) using type Ib synthetic diamond substrates at gas pressures of about 150 torr (~¼ atm) and temperatures of about 1000-1400° C. transformed the diamond substrate from yellow to green. The color change is achieved by placing the Ib diamond on a substrate holder with only modest thermal conductivity (e.g., hBN powder or Mo wires to hold the substrate). The color change appears similar to that reported for natural diamond on HPHT annealing. See I. M. Reinitz, et al., Gems & Gemology (2000) 36, 128. On the other hand, CVD diamond did not undergo obvious color changes and transformed to graphite at temperatures above 1800° C. in the same process. It was therefore of interest to anneal CVD diamond at higher temperature over 2000° C. by High Pressure/High Temperature (HPHT) methods.

CVD Growth Conditions

Single crystal diamonds were synthesized by microwave plasma chemical vapor deposition (CVD) at 8-20% $CH_4/H_2$, 0.2-3% $N_2/CH_4$, 160-220 torr at various temperatures. The diamonds shown in FIG. 1 were grown at the following temperatures: (a) 1300° C.; (b) 1250° C.; (c) 1400° C.; (d) 1200° C.; (e) 1050° C. Diamond (f) is the type Ib diamond substrate (4×4×1.5 $mm^3$). All substrates were HPHT synthetic type Ib yellow diamonds with {100} faces on top and on the sides. Morphologies and colors of the as-grown CVD diamonds strongly depend on the deposition temperature. The irregular edges with brown darker step-flow surfaces are associated with higher temperature (about 1300-1400° C.) [FIG. 1(a,b,c)]. The smooth colorless CVD diamonds enlarged along three dimensions are observed at lower temperature deposition [about 1050-1200° C., FIG. 1(c, d)]. At temperatures over about 1500° C., black layers begin to form. Below about 900° C., black microcrystalline material is deposited.

Figure 1:
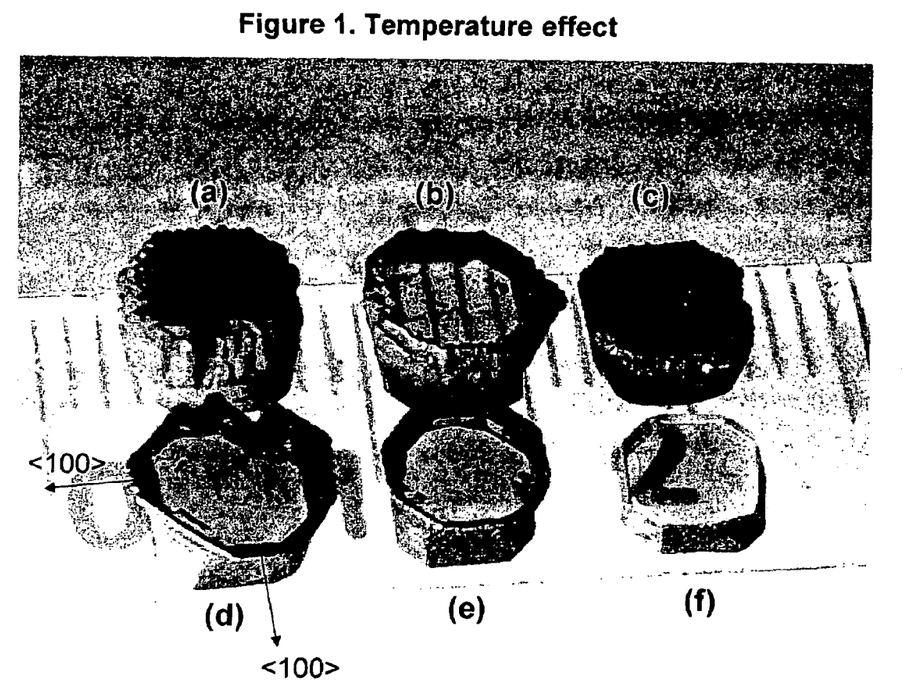
FIG. 1 provides photographs of CVD and aCVD diamonds grown under different conditions.

Notably, the top growth surface of the sample has been enlarged by a factor of two relative to the substrate [FIG. 1(d)], whereas the shape of the sample in FIG. 1(a) remains similar. This observation indicates that colorless CVD diamond with nitrogen added can be enlarged along three <100> directions at deposition temperatures around 1200° C. Such three-dimensional enlargement of the structures at around 1200° C. is important for continued growth to produce gem-quality diamond with much larger lateral dimensions than the substrates. Under these conditions, gem-quality CVD diamond can be grown individually and sequentially on the 6 {100} faces of the substrate. By this method, a one inch cube of single crystal diamond (~300 carat) is achievable.

Examples Based on Indentation Patterns after HPHT Annealing

Other aspects of the invention can be understood in greater detail from the following examples.

Various colorless to brown single crystal CVD diamonds were HPHT annealed (aCVD); all were all made colorless at temperatures of about 2000-2700° C. and about 5-7 GPa for about 10 minutes using a belt-type apparatus. Before HPHT annealing, these CVD diamonds exhibited high toughness, and after annealing the hardness of these diamonds increased dramatically.

Figure 2:
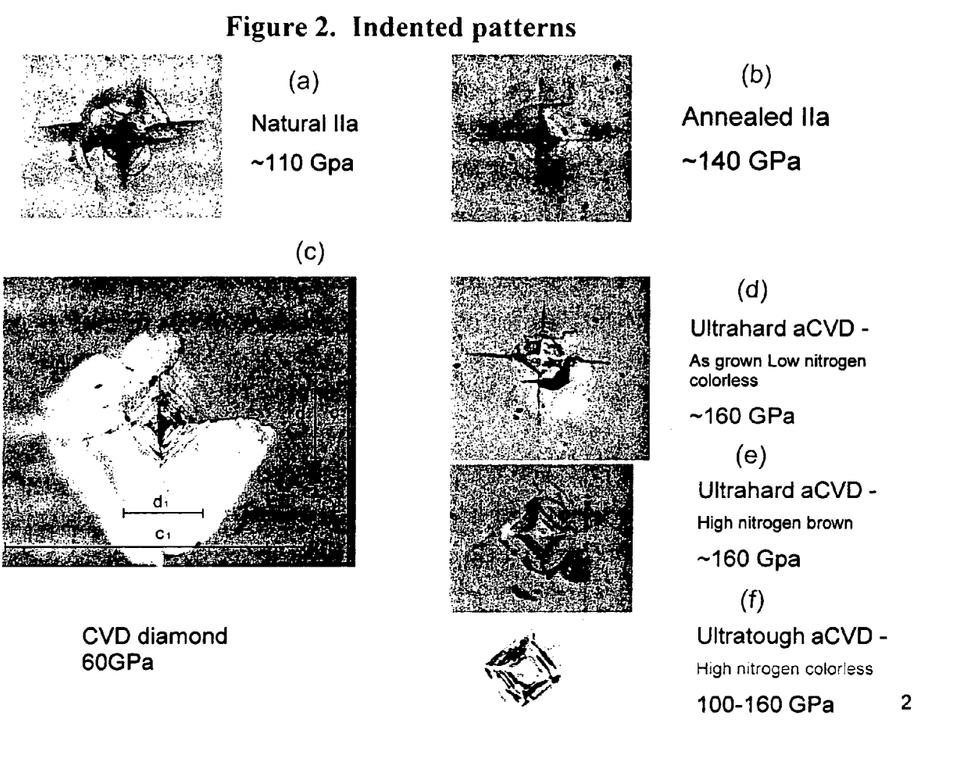
FIG. 2 depicts indentation patterns for various CVD and aCVD diamonds.

The indentation patterns of various diamonds are shown in FIG. 2. FIG. 2(a) shows the indentation pattern of Natural IIa diamond that has a hardness of approximately 110 GPa. FIG. 2(b) shows the indentation pattern of annealed IIa diamond with a hardness of approximately 140 GPa. FIG. 2(c) shows the indentation pattern of unannealed CVD diamond with a hardness of about 60 GPa. FIG. 2(d) shows the indentation pattern of annealed, colorless, ultrahard aCVD diamond grown under low nitrogen conditions, which has a hardness of about 160 GPa. FIG. 2(e) shows the indentation pattern of ultrahard aCVD diamond grown under high nitrogen conditions, which has a hardness of about 160 GPa. FIG. 2(f) shows the indentation pattern of colorless, ultratough aCVD diamond grown under high nitrogen conditions, with a hardness of from about 100 to about 160 GPa. The circular indentation patterns seen after annealing in the colorless diamonds grown at low nitrogen/methane ratio (about 0.4% $N_2/CH_4$) and about 1200° C. (FIG. 2(d)) are similar to those of annealed natural type IIa diamonds (FIG. 2(b)). The annealed dark brown diamonds grown with higher nitrogen (about 4% $N_2/CH_4$) and high temperatures (>about 1300° C.) (FIG. 2(e)) possess square fracture patterns; after annealing the darker CVD crystal cannot be readily indented—that is, it is superhard. A remarkable fracture pattern was observed for the colorless diamond grown at high nitrogen after annealing (FIG. 2(f)). Calculation of the toughness gives a lower limit of about 30 $MPa\, m^{1/2}$. As used herein, and unless otherwise specified, "ultratough" diamonds means diamonds with a toughness greater than about 30 $MPa\, m^{1/2}$.

Analysis

Figure 3:
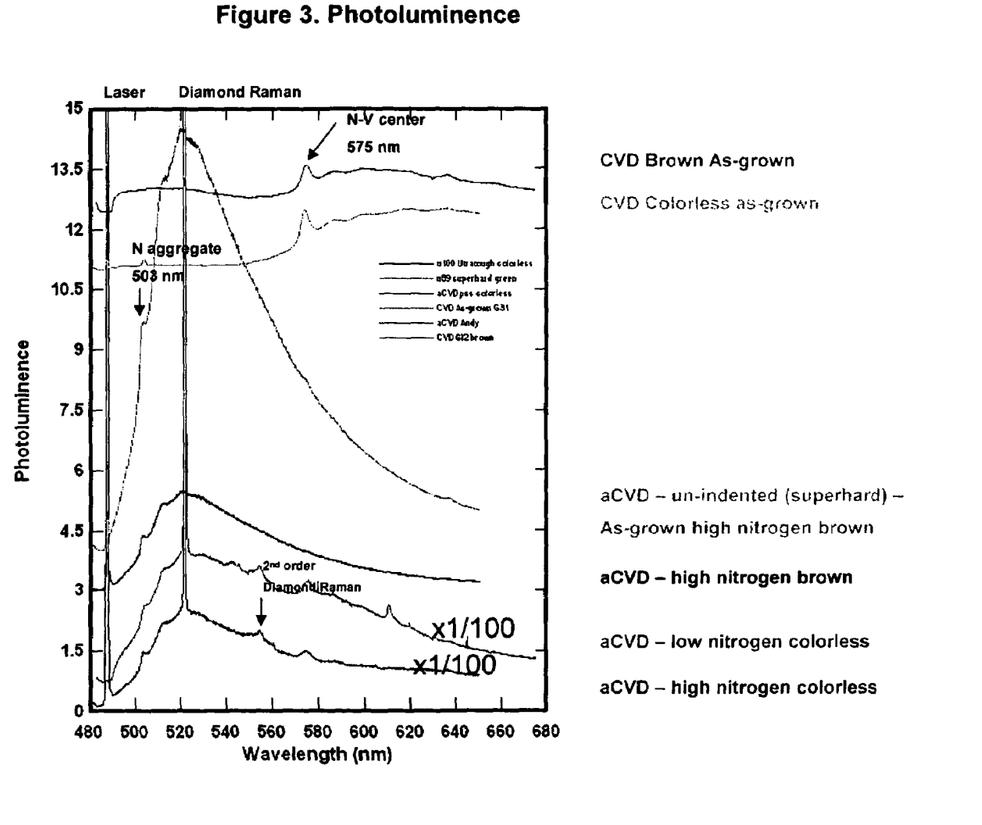
FIG. 3 is a photoluminescence spectra of various CVD and aCVD diamonds.

FIG. 3 shows Photoluminescence (PL) and Raman spectra that were measured with 488 nm excitation. CVD diamonds showed an obvious nitrogen-vacancy (N-V) center at 575 nm; the intensity of this band is higher for the brown relative to the colorless CVD diamonds. The as-grown brown CVD diamond that had been annealed to colorless possesses a strong nitrogen aggregate (H3) center (see S. J. Charles et al., (2004) *Physica Status Solidi* (a): 1-13) at 503 nm with a decrease in the band associated with the N-V center. Note that the H3 peak is strongest for the unindented (ultrahard) diamond. The annealed as-grown colorless CVD diamond possesses both H3 and N-V centers, but the intensities of these bands decreased by two orders after annealing, and the second-order Raman band of diamond appeared. The N-V centers in the annealed CVD (aCVD) may imply vacancy-rich CVD transforms to denser structures after HPHT annealing.

Figure 4:
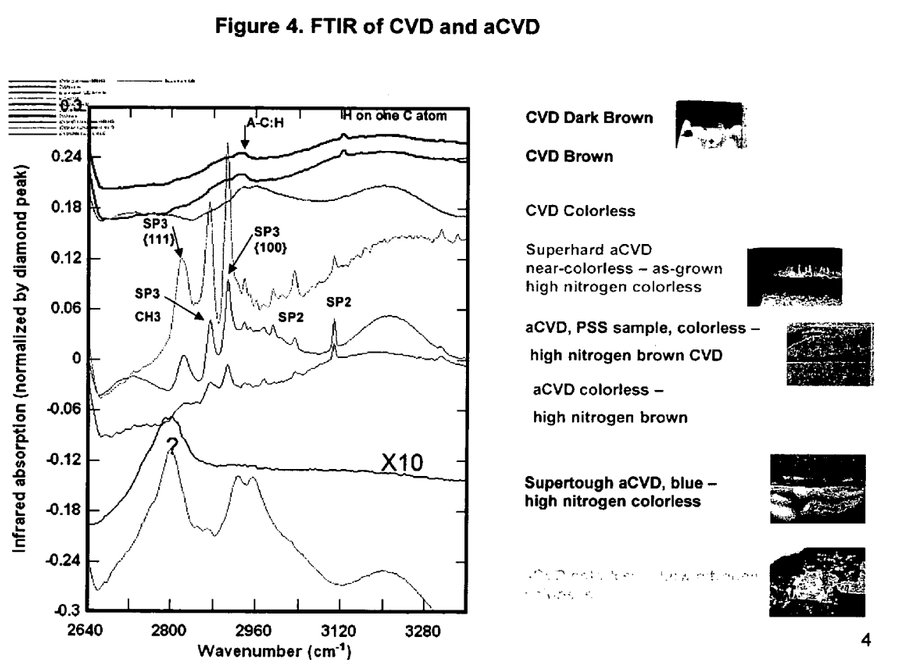
FIG. 4 shows infrared absorption (FTIR) data for various CVD and aCVD diamonds.

FIG. 4 shows the C—H stretching of infrared absorption in the range of 2800-3200 $cm^{-1}$. The broad band at 2930 $cm^{-1}$ attributed to hydrogenated amorphous carbon (a-C:H) is observed in the brown CVD diamond. This intensity correlates with the brown color of the diamond and its high toughness. As shown in FIG. 4, the a-C:H peak was annealed to various well-resolved C—H stretching bands at 2830 $cm^{-1}$ ($sp^3$ {111} defects), 2875 ($sp^3$-$CH_3$ defects), and 2900 $cm^{-1}$ ($sp^3$ {100} defects) as well as 2972, 3032 and 3107 $cm^{-1}$ ($sp^2$ defects) (see K. M. McNamaara et al. *J. Appl. Phys.* (1994) 76, 2466-2472). The {111} surfaces within the aCVD implies the relatively open a-C:H structure in the as-grown {100} CVD transformed on annealing to locally denser structure. For example, there is an increase in internal {111} defects and $sp^2$ carbon on the boundary. This change may contribute to the square <111> or <110> indented pattern in FIG. 2. The colorless CVD diamond has lower intensity bands associated with a-C:H exhibited a broad and intense band at 2800 $cm^{-1}$. This feature could be associated with unintentional contamination of boron (see Z. Teukam et al., *Natural Materials* (2003) 2: 482-486), related C—H modes (see K. M. McNamaara et al. *J. Appl. Phys.* (1994) 76, 2466-2472) or an unknown center (still under investigation). Ion microprobe analysis of the diamond revealed a maximum concentration of the N in the CVD diamond was approximately 75 times less than that of the type Ib substrate.

It is important to note that no grain boundaries were optically observed in aCVD diamonds. The aCVD crystals do not have obvious nitrogen-related absorption peaks at 1000-1500 $cm^{-1}$, even if a small amount of nitrogen is intentionally added to the synthesis gas; thus these diamonds may be considered type IIa. Without wishing to be bound by theory, it is believed that the mechanism of hardness/toughness enhancement and color changes in aCVD diamonds differs from annealed natural or HPHT synthetic diamond where nitrogen dominates.

Examination under crossed polarizers shows this CVD diamond has relatively high internal stress in comparison to other diamonds. After HPHT treatment the stress can be reduced, but in Ia, Ib, IIa diamonds the stress can increase after annealing. Without wishing to be bound by theory, it is believed that this phenomenon implies the hardness enhancement in annealed IIa may be due to stress-induced dislocation, although further investigation of this is needed (see K Kanda, (2003) *Diamond Related Matter,* 12, 1760-1765).

Additional information is obtained from measurements of x-ray rocking curve, including rocking curve maps. The full width at half-maximum (FWHM) of the colorless diamond is ~20 arcsec, brown CVD is ~80 arcsec, and aCVD is ~150-300 arcsec. Without wishing to be bound by theory, it is believed that the broadened FWHM in the aCVD crystal is likely associated with the a-C:H in CVD transforming to denser diamond domains with a fair amount of mosaic spread.

TABLE 1

Summary of analyses

| | As-grown | PL | FTIR at C-H | FWHM X-ray |
|---|---|---|---|---|
| Ultrahard aCVD | 4% $N_2/CH_4$, brown | H3 | {111} {100} face, $sp^2$ | No data |
| Superhard aCVD | 4% $N_2/CH_4$, Dark brown | Strong H3 | Sharp strong {111}, {100} face, $sp^2$ | 300 arcsec |
| Supertough aCVD | 0.4% $N_2/CH_4$, colorless | Weak N-V, H3 | Boron or unknown center | 150 arcsec |

The mechanism of the very high fracture toughness documented here may be associated with the small amount of amorphous carbon or dislocations that exist in these single-crystal CVD diamonds. Denser $sp^2$ or $sp^3$ hybridized nanocrystals combined with changes in nitrogen and hydrogen impurities on their grain boundary may occur during HPHT annealing.

The ultratough diamonds of the invention and diamonds produced by the above methods will be sufficiently large, tough, defect free and translucent so as to be useful as, for example, windows in high power laser or synchrotron applications, as anvils in high pressure apparatuses, as cutting instruments, as wire dies, as components for electronics (heat sinks, substrates for electronic devices), or as gems. Other examples of uses or applications for the above ultratough diamonds and diamonds made by the above methods include the following:

a.) wear resistant material—including, but not limited to, water/fluid jet nozzles, razors, surgical blades, microtone, hardness indentor, graphical tools, stichels, instruments used in the repair of lithographic pieces, missile radomes, bearings, including those used in ultra-high speed machines, diamond-biomolecule devices, microtomes, and hardness indentors;

b.) optical parts—including, but not limited to, optical windows, reflectors, refractors, lenses, gratings, etalons, alpha particle detectors, and prims;

c.) electronics—including, but not limited to, microchannel cooling assemblies; high purity SC-CVD diamonds for semiconductor components, SC-CVD doped with impurities for semiconductor components d.) anvils in high pressure apparatuses—including, but not limited to, the "Khvostantsev" or "Paris-Edinburgh" toroid shaped anvils that can be used with multiple optical, electrical, magnetic, and acoustic sensors; Bridgman anvils that are relatively large, have variable heights, and include major angles [15]; Multianviles, Drickamer cells, belt apparatus, piston-cylinder apparatus; precompressing samples for laser or magnetic shock wave studies; colorless, smooth coating for hydrogen and other applications, apparatus for pre-compressing samples for lasers or magnetic shock;

e.) containers—including, but not limited to, 6 edge {100} plated diamonds can be connected to each other to form a container, CVD diamond coating can be further employed to form a vacuum tight container;

f.) laser source—including, but not limited to, annealing SC-CVD diamond to form a stable H3 center (nitrogen aggregate, N-V center, Si center, or other dopants;

g.) superconductor and conducting diamond—including, but not limited to, HPHT annealing with SC-CVD diamond grown with an impurity such as H, Li, N, Mg, or another low atomic weight element with a size approaching that of carbon;

h.) substrate for other CVD diamond growth—using CVD plates as substrates for CVD growth has the advantage over natural or HPT substrates in large size and toughness (to avoid cracking during growth).

The ultratough diamonds disclosed herein are particularly useful in applications, including, but not limited to, water/fluid jet nozzles, razors, surgical blades, microtone, hardness indentor, graphical tools, stichels, instruments used in the repair of lithographic pieces, missile radomes, bearings, including those used in ultra-high speed machines, diamond-biomolecule devices, microtomes, hardness indentors, and anvils in high pressure apparatuses.

In one embodiment, the present invention is directed to anvils in high pressure apparatuses, wherein the anvils comprise ultratough single-crystal CVD diamond. Anvils comprising ultratough single-crystal CVD diamond can be used at higher pressures than anvils made of other materials, such as tungsten carbide. Examples of anvil designs that can comprise single crystal CVD diamonds include Bridgman anvils, including, but not limited to, Bridgman anvils that are relatively large, include variable heights, and include major angles and Paris-Edinburgh toroid anvils, including, but not limited to, those discussed in Khvostantsev, L. G., Vereshchagin, L. F., and Novikov, A. P., Device of toroid type for high pressure generation, High Temperatures-High Pressures, 1977, vol. 9, pp 637-638.

In another embodiment, the present invention is directed to an ultratough single-crystal CVD diamond that is laser inscribed with identifying marks (e.g., name, date, number) and a method of preparing such a diamond. The identifying marks can be laser inscribed onto a diamond substrate prior to starting the CVD process to prepare a single-crystal diamond. The mark is transferred to the single-crystal diamond through this process.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A single-crystal diamond grown by microwave plasma chemical vapor deposition that has a toughness of at least about 30 MPa $m^{1/2}$.

2. The single-crystal diamond of claim 1, wherein the toughness is at least about 35 MPa $m^{1/2}$.

3. The single-crystal diamond of claim 2, wherein the toughness is at least about 40 MPa $m^{1/2}$.

4. The single-crystal diamond of claim 1, wherein the hardness is from about 100 to about 160 GPa.

5. A nozzle comprising the single-crystal diamond of claim 1.

6. A cutting blade for a surgical instrument comprising a cutting edge, wherein the cutting edge comprises the single-crystal diamond of claim 1.

7. A razor comprising a cutting edge, wherein the cutting edge comprises the single-crystal diamond of claim 1.

8. A wire drawing die comprising the single-crystal diamond of claim 1.

9. A bearing comprising the single-crystal diamond of claim 1.

10. A diamond anvil comprising the single-crystal diamond of claim 1.

11. A gem comprising the single-crystal diamond of claim 1.

12. An optical part comprising the single-crystal diamond of claim 1.

* * * * *